(12) United States Patent
Kwon

(10) Patent No.: US 12,191,221 B2
(45) Date of Patent: Jan. 7, 2025

(54) SEMICONDUCTOR PACKAGE

(71) Applicant: Samsung Electronics Co., Ltd., Suwon-si (KR)

(72) Inventor: Yonghwan Kwon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 513 days.

(21) Appl. No.: 17/677,459

(22) Filed: Feb. 22, 2022

(65) Prior Publication Data

US 2023/0005806 A1   Jan. 5, 2023

(30) Foreign Application Priority Data

Jul. 5, 2021   (KR) .................. 10-2021-0087673

(51) Int. Cl.
*H01L 23/00* (2006.01)
*H01L 23/31* (2006.01)
*H01L 23/538* (2006.01)
*H01L 25/065* (2023.01)

(52) U.S. Cl.
CPC ...... *H01L 23/3128* (2013.01); *H01L 23/5383* (2013.01); *H01L 24/16* (2013.01); *H01L 24/32* (2013.01); *H01L 25/0652* (2013.01); *H01L 2224/16227* (2013.01); *H01L 2224/32145* (2013.01); *H01L 2225/06548* (2013.01)

(58) Field of Classification Search
CPC ...... H01L 24/16; H01L 24/32; H01L 23/3128
See application file for complete search history.

(56) References Cited

U.S. PATENT DOCUMENTS

| | | |
|---|---|---|
| 6,841,883 B1 | 1/2005 | Farnworth et al. |
| 6,972,487 B2 | 12/2005 | Kato et al. |
| 7,402,911 B2 | 7/2008 | Thomas et al. |
| 9,396,300 B2 | 7/2016 | Wang et al. |
| 9,633,974 B2 | 4/2017 | Zhai et al. |
| 9,793,230 B1* | 10/2017 | Yu .................. H01L 23/3171 |
| 9,831,215 B1* | 11/2017 | Chen .................. H01L 25/50 |
| 10,049,953 B2 | 8/2018 | Yu et al. |
| 10,269,767 B2 | 4/2019 | Chen et al. |
| 11,854,921 B2* | 12/2023 | Yu .................. H01L 23/5389 |

(Continued)

FOREIGN PATENT DOCUMENTS

KR   102205195 B1   1/2021

*Primary Examiner* — Errol V Fernandes
(74) *Attorney, Agent, or Firm* — Finnegan, Henderson, Farabow, Garrett & Dunner, LLP

(57) ABSTRACT

A semiconductor package may include a redistribution substrate including first and second surfaces opposite each other, a first semiconductor chip on the first surface, a first molding portion on a side surface of the first semiconductor chip, a second semiconductor chip between the first semiconductor chip and the redistribution substrate, a second molding portion between the redistribution substrate and the first molding portion and on a side surface of the second semiconductor chip, bump patterns between the second semiconductor chip and the redistribution substrate, and a mold via penetrating the second molding portion and electrically connecting the first semiconductor chip to the redistribution substrate. The redistribution substrate may include first and second redistribution patterns sequentially in an insulating layer. The mold via may contact the second redistribution pattern, and the bump patterns may contact the first redistribution pattern.

20 Claims, 14 Drawing Sheets

(56) References Cited

U.S. PATENT DOCUMENTS

| | | | |
|---|---|---|---|
| 2017/0110441 A1* | 4/2017 | Tan | ........................ H01L 25/50 |
| 2018/0068985 A1* | 3/2018 | Chiu | ................. H01L 21/31053 |
| 2019/0027465 A1 | 1/2019 | Yeh et al. | |
| 2020/0020629 A1 | 1/2020 | Wagner et al. | |
| 2020/0328183 A1 | 10/2020 | Chen et al. | |
| 2021/0035953 A1 | 2/2021 | Yu et al. | |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2021-0087673, filed on Jul. 5, 2021, in the Korean Intellectual Property Office, the entire contents of which are hereby incorporated by reference.

BACKGROUND

The present disclosure relates to a semiconductor package, and more particularly, to a semiconductor package including a mold via.

With the recent advance in the electronics industry, demand has increased for high-performance, high-speed, and compact electronic components. To meet this demand, packaging technologies for mounting a plurality of semiconductor chips in a single package are being developed.

Recently, demand for portable electronic devices is rapidly increasing in the market, and thus, it may be necessary to reduce the sizes and weights of electronic components constituting the portable electronic devices. For this, it may be necessary to develop technologies of reducing a size and a weight of each component and packaging technologies of integrating several components in a single package. For a semiconductor package used to process high frequency signals, it may be necessary not only to reduce a size of a product but also to realize good electrical characteristics.

SUMMARY

An embodiment of inventive concepts provides a semiconductor package with improved reliability.

An embodiment of inventive concepts provides a semiconductor package with a reduced size.

According to an embodiment of inventive concepts, a semiconductor package may include a redistribution substrate including a first surface opposite a second surface, a first semiconductor chip on the first surface of the redistribution substrate, a first molding portion on a side surface of the first semiconductor chip, a second semiconductor chip between the first semiconductor chip and the redistribution substrate, a second molding portion between the redistribution substrate and the first molding portion and on a side surface of the second semiconductor chip, bump patterns between the second semiconductor chip and the redistribution substrate, and a mold via penetrating the second molding portion and electrically connecting the first semiconductor chip to the redistribution substrate. The redistribution substrate may include an insulating layer, a first redistribution pattern in the insulating layer, and a second redistribution pattern in the insulating layer. The first redistribution pattern and the second redistribution pattern may be sequentially stacked in a direction from the first surface of the redistribution substrate toward the second surface. The mold via may be in contact with the second redistribution pattern, and the bump patterns may be in contact with the first redistribution pattern.

According to an embodiment of inventive concepts, a semiconductor package may include a redistribution substrate including a first surface opposite a second surface, a first semiconductor chip and a second semiconductor chip on the first surface of the redistribution substrate, a third semiconductor chip between the first semiconductor chip and the redistribution substrate and between the second semiconductor chip and the redistribution substrate, a first molding portion on a side surface of each of the first semiconductor chip and the second semiconductor chip, a second molding portion between the redistribution substrate and the first molding portion and on a side surface of the third semiconductor chip, and a mold via penetrating the second molding portion and electrically connecting the redistribution substrate to the first semiconductor chip. A width of the mold via in the second molding portion may increase in a direction from the first semiconductor chip toward the redistribution substrate. Each of the first semiconductor chip and the second semiconductor chips may include an active surface and an inactive surface, which are opposite each other. The first molding portion may be in contact with the inactive surface of each of the first semiconductor chip and the second semiconductor chip.

According to an embodiment of inventive concepts, a semiconductor package may include a redistribution substrate, a first semiconductor chip and a second semiconductor chip on a first surface of the redistribution substrate, a first chip pad adjacent to an active surface of the first semiconductor chip, a second chip pad adjacent to an active surface of the second semiconductor chip, a first molding portion on a side surface and an inactive surface of each of the first semiconductor chips and the second semiconductor chip, a third semiconductor chip between the first semiconductor chip and the redistribution substrate and between the second semiconductor chip and the redistribution substrate, an adhesive layer between the first semiconductor chip and the third semiconductor chip and between the second semiconductor chip and the third semiconductor chip, a second molding portion between the redistribution substrate and the first molding portion and on a side surface and a top surface of the third semiconductor chip, bump patterns, and a connection terminal. The redistribution substrate may include a first surface and second surface, which may be opposite each other, and the redistribution substrate may include an insulating layer, a first redistribution pattern in the insulating layer, a second redistribution pattern in the insulating layer, a third redistribution pattern in the insulating layer, and a bonding pad on the third redistribution pattern. The first redistribution pattern, the second redistribution pattern, and the third redistribution pattern may be sequentially stacked in a direction from the first surface of the redistribution substrate toward the second surface. Each of the first and second semiconductor chips may include active surface and the inactive surface, which may be opposite to each other. The bump patterns may be between the redistribution substrate and the third semiconductor chip. The mold via may penetrate the second molding portion and may electrically connect the redistribution substrate to the first semiconductor chip. The connection terminal may be on the bonding pad. The mold via may be in contact with the second redistribution pattern, and the bump patterns may be in contact with the first redistribution pattern.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Example embodiments of inventive concepts will now be described more fully with reference to the accompanying drawings, in which example embodiments are shown.

Figure 1:
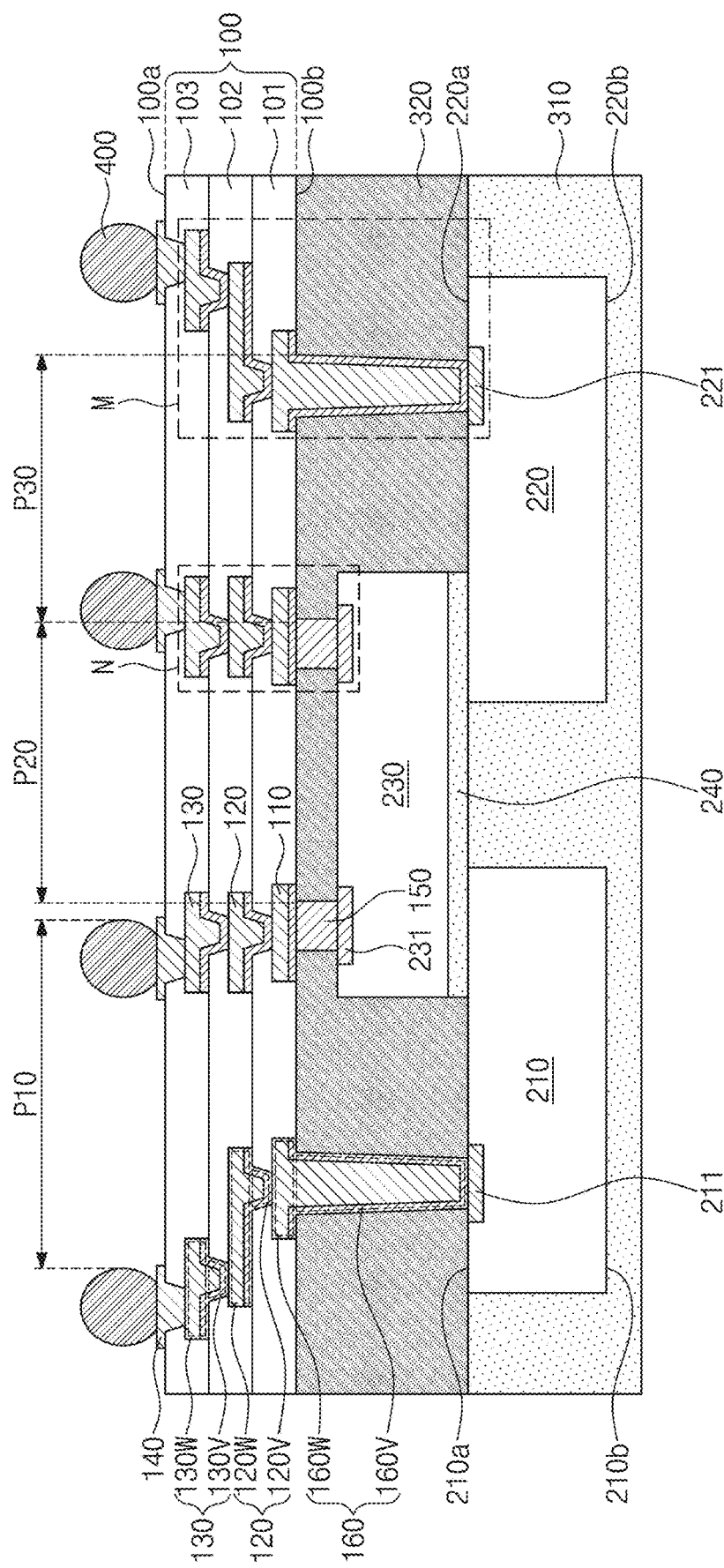
FIG. 1 is a sectional view illustrating a semiconductor package according to an embodiment of inventive concepts.
Figure 2A:
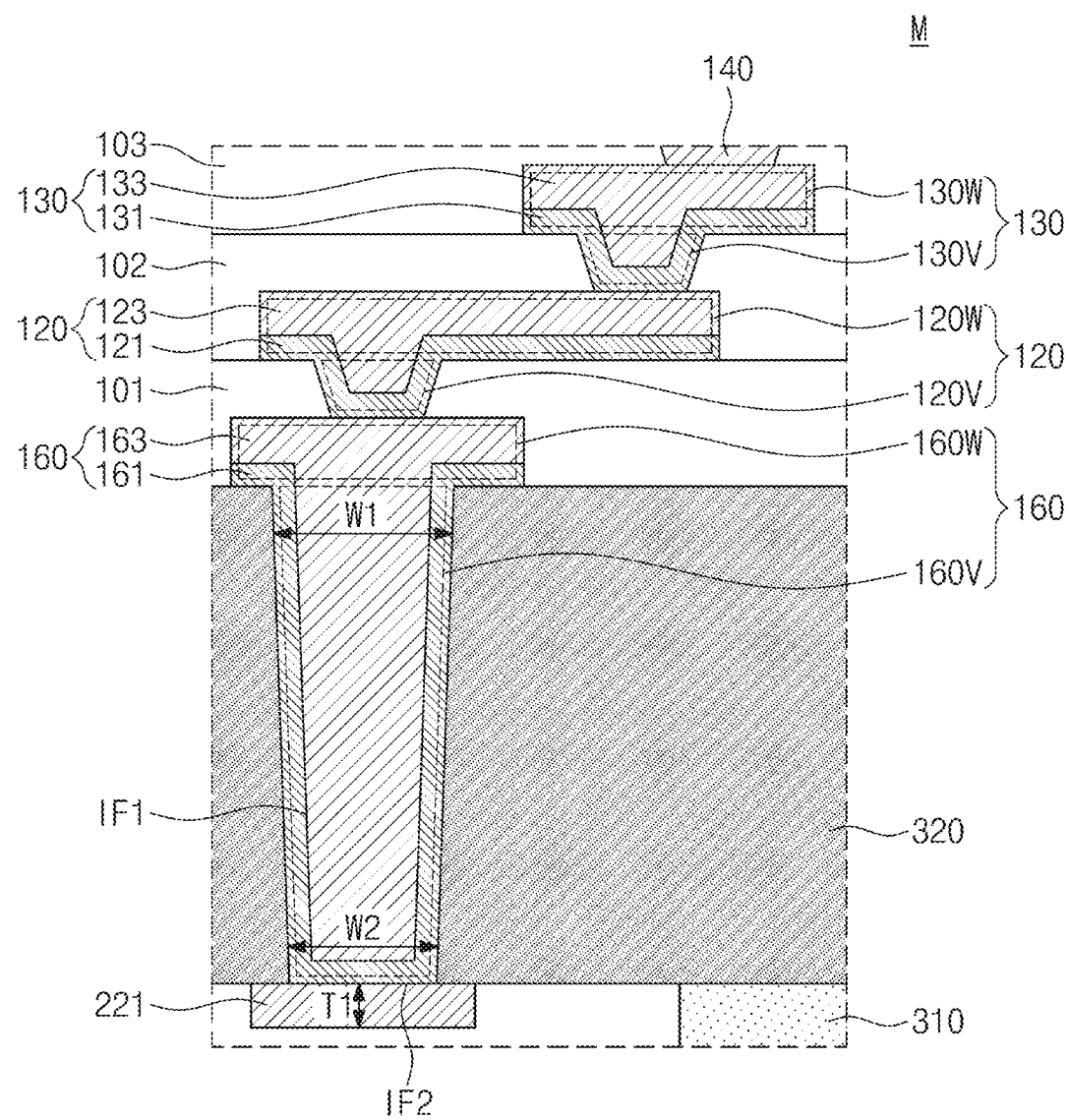
FIG. 2A is an enlarged sectional view illustrating a portion 'M' of FIG. 1.
Figure 2B:
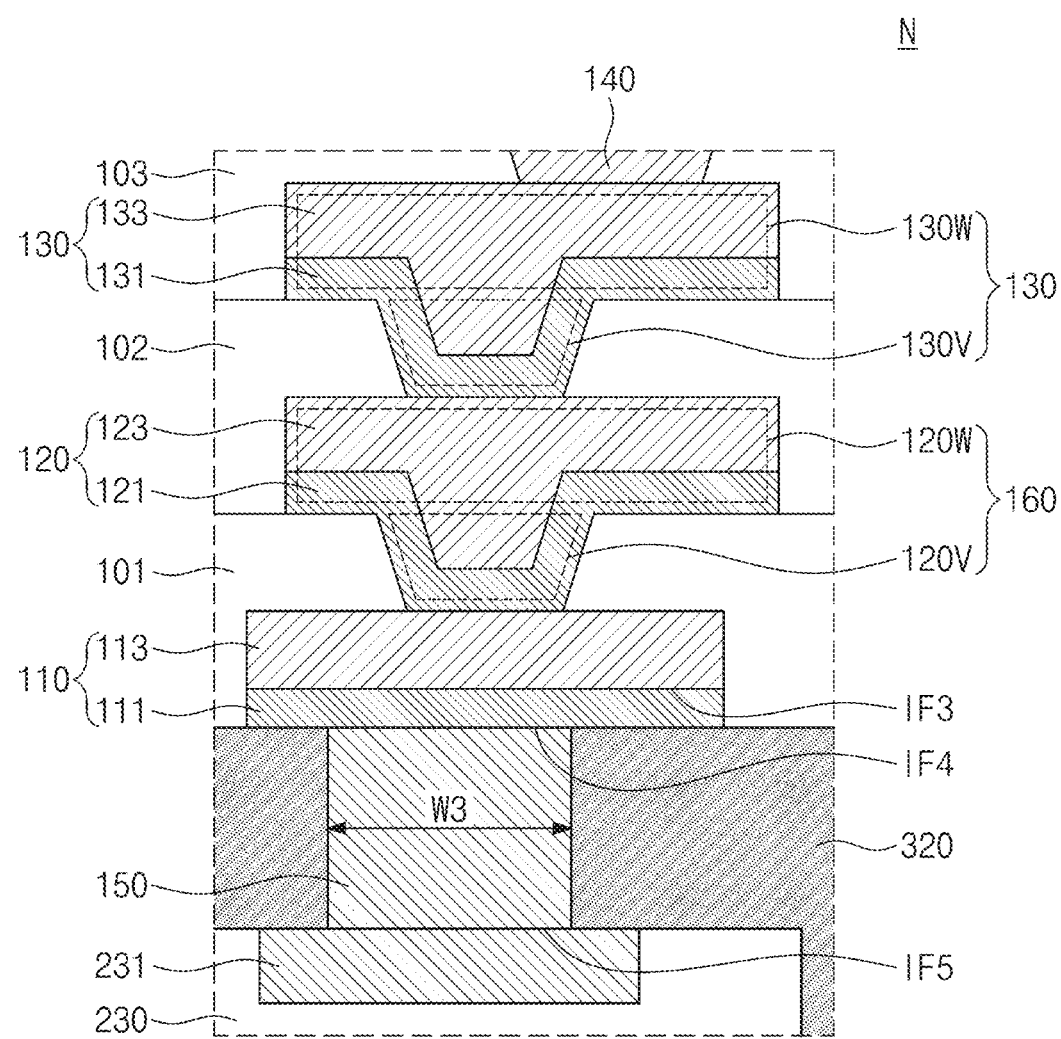
FIG. 2B is an enlarged sectional view illustrating a portion 'N' of FIG. 1.

FIG. 1 is a sectional view illustrating a semiconductor package according to an embodiment of inventive concepts. FIG. 2A is an enlarged sectional view illustrating a portion 'M' of FIG. 1. FIG. 2B is an enlarged sectional view illustrating a portion 'N' of FIG. 1.

Referring to FIG. 1, a semiconductor package according to an embodiment of inventive concepts may include a redistribution substrate 100. The redistribution substrate 100 may include insulating layers 101, 102, and 103, a first redistribution pattern 110, a second redistribution pattern 120, a third redistribution pattern 130, and a bonding pad 140.

The redistribution substrate 100 may include a first surface 100a and a second surface 100b, which are opposite to each other. As an example, the first surface 100a of the redistribution substrate 100 may be a top surface of the redistribution substrate 100, and the second surface 100b of the redistribution substrate 100 may be a bottom surface of the redistribution substrate 100.

The insulating layers 101, 102, and 103 may include a first insulating layer 101, a second insulating layer 102, and a third insulating layer 103, which are sequentially stacked in a direction from the second surface 100b of the redistribution substrate 100 toward the first surface 100a. In other words, first to the third insulating layers 101, 102, and 103 may be sequentially stacked in a direction perpendicular to the first surface 100a of the redistribution substrate 100. The redistribution substrate 100 may be referred to as an interconnection structure. The first surface 100a of the redistribution substrate 100 may be a top surface of the third insulating layer 103. The second surface 100b of the redistribution substrate 100 may be a bottom surface of the first insulating layer 101.

The first redistribution pattern 110 may be disposed in the first insulating layer 101. The first redistribution pattern 110 may be provided on a bump pattern 150, which will be described below. The first insulating layer 101 may be the lowermost one of the insulating layers. A bottom surface of the first redistribution pattern 110 may be located at substantially the same level as the second surface 100b of the redistribution substrate 100. The first insulating layer 101 may be formed of or include at least one of organic materials (e.g., a photosensitive polymer) or photo-imageable dielectric (PID) resins. In the present specification, the photosensitive polymer may include at least one of, for example, photosensitive polyimide, polybenzoxazole, phenol-based polymer, or benzocyclobutene-based polymer.

The second insulating layer 102 may be disposed on the first insulating layer 101. The second insulating layer 102 may be formed of or include the same material as the first insulating layer 101. For example, the second insulating layer 102 may be formed of or include an organic material (e.g., a photosensitive polymer) or a photosensitive insulating resin.

The second redistribution pattern 120 may be disposed on the first redistribution pattern 110. The second redistribution pattern 120 may be electrically connected to one of the first redistribution pattern 110 or a mold via 160, which will be described below.

The second redistribution pattern 120 may include a via portion 120V and a wire portion 120W. The wire portion 120W of the second redistribution pattern 120 may be disposed in the second insulating layer 102. The wire portion 120W of the second redistribution pattern 120 may be disposed on a top surface of the first insulating layer 101. The wire portion 120W of the second redistribution pattern 120 may be in contact with the third redistribution pattern 130, which will be described below. The via portion 120V of the second redistribution pattern 120 may be provided on the first redistribution pattern 110 or the mold via 160 and may be connected to the wire portion 120W of the second redistribution pattern 120. The via portion 120V may be a portion of the second redistribution pattern 120 which is extended from the wire portion 120W of the second redistribution pattern 120 in a direction perpendicular to the first surface 100a of the redistribution substrate 100. In detail, the via portion 120V may be a portion of the second redistribution pattern 120 which is extended from the wire portion 120W of the second redistribution pattern 120 in a direction from the first surface 100a of the redistribution substrate 100 toward the second surface 100b. The wire portion 120W of the second redistribution pattern 120 may have a width or length that is larger than that of the via portion 120V of the second redistribution pattern 120. The via portion 120V of the second redistribution pattern 120 may be provided in the first insulating layer 101. The via portion 120V of the second redistribution pattern 120 may be in contact with the first redistribution pattern 110 or the mold via 160.

The third insulating layer 103 may be disposed on the second insulating layer 102. The third insulating layer 103 may be formed of or include the same material as the first insulating layer 101. For example, the third insulating layer 103 may be formed of or include an organic material (e.g., a photosensitive polymer) or a photosensitive insulating resin.

The third redistribution pattern 130 may be disposed on the second redistribution pattern 120. The third redistribution pattern 130 may be electrically connected to the second redistribution pattern 120.

The third redistribution pattern 130 may include a via portion 130V and a wire portion 130W. The wire portion 130W of the third redistribution pattern 130 may be disposed in the third insulating layer 103. The wire portion 130W of the third redistribution pattern 130 may be disposed on a top surface of the second insulating layer 102. The wire portion 130W of the third redistribution pattern 130 may be in contact with the bonding pad 140, which will be described below. The via portion 130V of the third redistribution pattern 130 may be provided on the second redistribution pattern 120 and may be connected to the wire portion 130W of the third redistribution pattern 130. The via portion 130V may be a portion of the third redistribution pattern 130 which is extended from the wire portion 130W of the third redistribution pattern 130 in the direction perpendicular to the first surface 100a of the redistribution substrate 100. In detail, the via portion 130V may be a portion of the third redistribution pattern 130 which is extended from the wire portion 130W of the third redistribution pattern 130 in the direction from the first surface 100a of the redistribution substrate 100 toward the second surface 100b. The wire portion 130W of the third redistribution pattern 130 may have a width or length that is larger than that of the via portion 130V of the third redistribution pattern 130. The via portion 130V of the third redistribution pattern 130 may be provided in the second insulating layer 102. The via portion 130V of the third redistribution pattern 130 may be in contact with the second redistribution pattern 120.

The bonding pad 140 may be disposed on the third redistribution pattern 130. The bonding pad 140 may be provided on the first surface 100a of the redistribution substrate 100. The bonding pad 140 may serve as a pad of a connection terminal 400, which will be described below. The bonding pad 140 may be formed of or include at least one of copper (Cu), aluminum (Al), silver (Ag), tin (Sn), gold (Au), nickel (Ni), lead (Pb), titanium (Ti), or combinations thereof.

The bonding pad 140 may include a body portion and a via portion. The body portion of the bonding pad 140 may be a portion that is disposed on the first surface 100a of the redistribution substrate 100. The via portion of the bonding pad 140 may be a portion that is extended from the body portion of the bonding pad 140 and is disposed in the third insulating layer 103. The via portion of the bonding pad 140 may be in contact with the third redistribution pattern 130. The body portion of the bonding pad 140 may have a width or length that is larger than that of the via portion of the bonding pad 140.

A first semiconductor chip 210 and a second semiconductor chip 220 may be disposed on the second surface 100b of the redistribution substrate 100. The first and second semiconductor chips 210 and 220 may be spaced apart from the second surface 100b of the redistribution substrate 100. The first and second semiconductor chips 210 and 220 may be spaced apart from each other in a horizontal direction. As an example, each of the first and second semiconductor chips 210 and 220 may be a memory chip (e.g., a DRAM, SRAM, MRAM, or FLASH memory chip). In an embodiment, each of the first and second semiconductor chips 210 and 220 may be a logic chip.

The first semiconductor chip 210 may include an active surface 210a and an inactive surface 210b, which are opposite to each other. The second semiconductor chip 220 may include an active surface 220a and an inactive surface 220b, which are opposite to each other. The active surface 210a of the first semiconductor chip 210 and the active surface 220a of the second semiconductor chip 220 may be adjacent to the second surface 100b of the redistribution substrate 100.

A first chip pad 211 may be provided adjacent to the active surface 210a of the first semiconductor chip 210. A second chip pad 221 may be provided adjacent to the active surface 220a of the second semiconductor chip 220. A top surface of the first chip pad 211 may be exposed by the active surface 210a of the first semiconductor chip 210. A top surface of the second chip pad 221 may be exposed by the active surface 220a of the second semiconductor chip 220. Each of the first and second chip pads 211 and 221 may be formed of or include a conductive metallic material. As an example, each of the first and second chip pads 211 and 221 may be formed of or include copper (Cu).

A first molding portion 310 may cover the first and second semiconductor chips 210 and 220. The first molding portion 310 may be provided on a side surface of the first semiconductor chip 210. The first molding portion 310 may be provided to enclose or cover opposite side surfaces of the first semiconductor chip 210. The first molding portion 310 may be provided on a side surface of the second semiconductor chip 220. The first molding portion 310 may be provided to enclose or cover opposite side surfaces of the second semiconductor chip 220. As an example, the first molding portion 310 may be formed of or include an insulating polymer (e.g., an epoxy-based polymer). The first molding portion 310 may further include a reinforcement element (e.g., a silicon filler).

The first molding portion 310 may be in contact with the inactive surface 210b of the first semiconductor chip 210 and the inactive surface 220b of the second semiconductor chip 220. The first molding portion 310 may be provided to cover the inactive surface 210b of the first semiconductor chip 210 and to cover the inactive surface 220b of the second semiconductor chip 220. A top surface of the first molding portion 310 may be substantially coplanar with a top surface of the first semiconductor chip 210 and a top surface of the second semiconductor chip 220.

A third semiconductor chip 230 may be disposed on the first and second semiconductor chips 210 and 220. The third semiconductor chip 230 may be provided between the redistribution substrate 100 and the first semiconductor chip 210 and between the redistribution substrate 100 and the second semiconductor chip 220. In an embodiment, the third semiconductor chip 230 may be a logic chip. The third semiconductor chip 230 may be configured to drive each of the first and second semiconductor chips 210 and 220.

The third semiconductor chip 230 may include an active surface and an inactive surface, which are opposite to each other. The active surface of the third semiconductor chip 230 may be adjacent to the second surface 100b of the redistribution substrate 100. Third chip pads 231 may be disposed adjacent to the active surface of the third semiconductor chip 230. A top surface of each of the third chip pads 231 may be exposed to the outside of the third semiconductor chip 230 near the active surface of the third semiconductor chip 230. The third chip pads 231 may be formed of or include a conductive metallic material. As an example, each of the third chip pads 231 may be formed of or include copper (Cu).

An adhesive layer 240 may be disposed below the inactive surface of the third semiconductor chip 230. The adhesive layer 240 may be used to attach the third semiconductor chip 230 to the first semiconductor chip 210 and to attach the third semiconductor chip 230 to the second semiconductor chip 220. The adhesive layer 240 may be interposed between the first semiconductor chip 210 and the third semiconductor chip 230 and between the second semiconductor chip 220 and the third semiconductor chip 230. The adhesive layer 240 may be in contact with a portion of the first molding portion 310. The adhesive layer 240 may include an adhesive insulating film (e.g., Ajinomoto build-up film (ABF)) or an insulating polymer (e.g., epoxy-based polymer). The adhesive layer 240 may be in contact with the active surface 210a of the first semiconductor chip 210 and the active surface 220a of the second semiconductor chip 220. A bottom surface of the adhesive layer 240 may be coplanar with a bottom surface of a second molding portion 320, which will be described below. Positions, widths, and thicknesses of the first to third semiconductor chips 210, 220, and 230 may not be limited to those in the illustrated example and may be variously changed.

According to an embodiment of inventive concepts, the first and second semiconductor chips 210 and 220 may stably support the third semiconductor chip 230. Accordingly, reliability of the semiconductor package may be improved.

In addition, the first to third semiconductor chips 210 to 230 may not be mounted separately in a plurality of package substrates, unlike a conventional package-on-package structure, in which the first and second semiconductor chips 210 and 220 are mounted in a lower package and the third semiconductor chip 230 is mounted in an upper package. Accordingly, it may be possible to reduce a total thickness of the semiconductor package, to omit a process of additionally forming a redistribution substrate or a post, and to simplify a fabrication process. As a result, it may be possible to reduce a size and fabrication cost of the semiconductor package.

The second molding portion 320 may cover the third semiconductor chip 230. The second molding portion 320 may be interposed between the redistribution substrate 100 and the first molding portion 310. The second molding portion 320 may be provided on a side surface of the third semiconductor chip 230. The second molding portion 320 may be provided to enclose or cover opposite side surfaces of the third semiconductor chip 230. The second molding portion 320 may be in contact with a top surface of the third semiconductor chip 230. In detail, the second molding portion 320 may be in contact with the active surface of the third semiconductor chip 230. The second molding portion 320 may cover the top surface of the third semiconductor chip 230.

In an embodiment, the second molding portion 320 may be formed of or include an insulating polymer (e.g., an epoxy-based polymer). The second molding portion 320 may further include a reinforcement element (e.g., a silicon filler).

The first and second molding portions 310 and 320 may be formed of or include different epoxy-based polymers. In an embodiment, the first and second molding portions 310 and 320 may be formed of or include the same epoxy-based polymer but the contents of the reinforcement elements (e.g., silicon fillers) therein may be different from each other. For example, the content of the reinforcement element in the first molding portion 310 may be smaller or greater than the content of the reinforcement element in the second molding portion 320. The first and second molding portions 310 and 320 may have different material properties from each other. For example, the first and second molding portions 310 and 320 may differ from each other in thermal expansion coefficient and/or elastic modulus. For example, the thermal expansion coefficient of the first molding portion 310 may be smaller or greater than the thermal expansion coefficient of the second molding portion 320. The elastic modulus of the first molding portion 310 may be smaller or greater than the elastic modulus of the second molding portion 320.

The first and second molding portions 310 and 320 may have different thicknesses from each other. For example, the thickness of the first molding portion 310 may be smaller or larger than the thickness of the second molding portion 320. In an embodiment, the thickness of the first molding portion 310 may be substantially equal to the thickness of the second molding portion 320.

Since the first molding portion 310 covering the first and second semiconductor chips 210 and 220 has a different material property from the second molding portion 320 covering the third semiconductor chip 230, it may be possible to more easily control a warpage phenomenon in the semiconductor package. Thus, reliability of the semiconductor package may be improved.

The bump patterns 150 may be disposed on the third semiconductor chip 230. The bump patterns 150 may be provided on the third chip pads 231, respectively. Each of the bump patterns 150 may be formed of or include a conductive metallic material. For example, each of the bump patterns 150 may be formed of or include copper (Cu). A top surface of each of the bump patterns 150 may be substantially coplanar with a top surface of the second molding portion 320. The bump patterns 150 may be provided to penetrate the second molding portion 320 and to be in contact with the third chip pads 231.

The third semiconductor chip 230 and the redistribution substrate 100 may be electrically connected to each other by the bump patterns 150. In detail, the bump patterns 150 may be provided to be in contact with the first redistribution pattern 110 and to electrically connect the third semiconductor chip 230 to the redistribution substrate 100.

The mold via 160 may be provided to penetrate the second molding portion 320. The mold via 160 may be used to electrically connect the first semiconductor chip 210 to the redistribution substrate 100 and to electrically connect the second semiconductor chip 220 to the redistribution substrate 100.

The mold via 160 may include a via portion 160V and a wire portion 160W. The wire portion 160W of the mold via 160 may be disposed in the first insulating layer 101. The wire portion 160W of the mold via 160 may be disposed on the second molding portion 320. The wire portion 160W of the mold via 160 may be located at substantially the same level as the first redistribution pattern 110. As an example, a top surface of the wire portion 160W of the mold via 160 and a top surface of the first redistribution pattern 110 may be located at substantially the same level. A bottom surface of the wire portion 160W of the mold via 160 may be coplanar with the bottom surface of the first redistribution pattern 110. The mold via 160 may be in contact with the second redistribution pattern 120. The wire portion 160W of the mold via 160 may be in contact with the via portion 120V of the second redistribution pattern 120.

The via portion 160V may be a portion of the mold via 160 which is vertically extended to penetrate the second molding portion 320. The via portion 160V of the mold via 160 may be in contact with the first chip pad 211 of the first semiconductor chip 210 or the second chip pad 221 of the second semiconductor chip 220.

The via portion 160V of the mold via 160 may be connected to the wire portion 160W of the mold via 160. The via portion 160V may be a portion of the mold via 160 which is extended from the wire portion 160W of the mold via 160 in a direction perpendicular to the first surface 100a of the redistribution substrate 100. In detail, the via portion 160V may be a portion of the mold via 160 which is extended from the wire portion 160W of the mold via 160 in a direction from the first surface 100a of the redistribution substrate 100 toward the second surface 100b. The wire portion 160W of the mold via 160 may have a width or length larger than the via portion 160V of the mold via 160.

The connection terminal 400 may be disposed on the bonding pad 140. The connection terminal 400 may be provided on the body portion of the bonding pad 140. The connection terminal 400 may be electrically connected to the first to third semiconductor chips 210, 220, and 230 through the redistribution substrate 100. The connection terminal 400 may include a solder ball, a solder bump, a solder pillar, and/or combinations thereof. In an embodiment, the connection terminal 400 may be formed of or include a soldering material.

In an embodiment, a plurality of the connection terminals 400 may be provided. A pitch between the connection terminals 400 may be a first pitch P10. A pitch between the bump patterns 150 may be a second pitch P20. A pitch between the bump pattern 150 and the mold via 160, which are adjacent to each other, may be a third pitch P30. The first pitch P10 may be larger than both of the second pitch P20 and the third pitch P30. The second pitch P20 may be equal to or different from the third pitch P30.

FIG. 2A is an enlarged sectional view illustrating a portion 'M' of FIG. 1. FIG. 2B is an enlarged sectional view illustrating a portion 'N' of FIG. 1. The redistribution patterns 110, 120, and 130, the mold via 160, and the bump patterns 150 will be described in more detail with reference to FIGS. 2A and 2B. In the following description, an element previously described with reference to FIG. 1 may not be described in much further detail for the sake of brevity.

Referring to FIG. 2A, the mold via 160 may include a seed pattern 161 and a conductive pattern 163. The conductive pattern 163 of the mold via 160 may be provided in the first insulating layer 101 and in the second molding portion 320. The conductive pattern 163 of the mold via 160 may be formed of or include a conductive material. As an example, the conductive pattern 163 of the mold via 160 may be formed of or include copper (Cu). The seed pattern 161 of the mold via 160 may be interposed between the second chip pad 221 and the conductive pattern 163 of the mold via 160 and between the second molding portion 320 and the conductive pattern 163 of the mold via 160. The seed pattern 161 of the mold via 160 may be in contact with the second chip pad 221. The seed pattern 161 of the mold via 160 may be formed of or include a conductive material. As an example, the seed pattern 161 of the mold via 160 may be formed of or include electroless copper. The seed pattern 161 of the mold via 160 may not include titanium (Ti). Since the seed pattern 161 of the mold via 160 is formed on the second molding portion 320, it may be possible to use the electroless copper, unlike the case that it is formed on the insulating layers 101, 102, and 103 including a photosensitive insulating resin.

The seed and conductive patterns 161 and 163 of the mold via 160 may be formed of or include the same metallic material. In an embodiment, each of the seed and conductive patterns 161 and 163 of the mold via 160 may be formed of or include copper (Cu). A density of a metallic material of the seed pattern 161 of the mold via 160 may be different from a density of a metallic material of the conductive pattern 163 of the mold via 160. For example, the density of the metallic material of the seed pattern 161 of the mold via 160 may be smaller than the density of the metallic material of the conductive pattern 163 of the mold via 160.

Each of the via and wire portions 160V and 160W of the mold via 160 may include the seed and conductive patterns 161 and 163 of the mold via 160. The seed pattern 161 of the mold via 160 may not be extended to regions on side and top surfaces of the conductive pattern 163 of the mold via 160.

An interface between the seed and conductive patterns 161 and 163 of the mold via 160 may be a first interface IF1. Since the seed and conductive patterns 161 and 163 of the mold via 160 include the same metallic material, the first interface IF1 may be invisible. For example, the seed and conductive patterns 161 and 163 of the mold via 160 may be provided as a single element.

An upper width of the via portion 160V of the mold via 160 may be a first width W1. A lower width of the via portion 160V of the mold via 160 may be a second width W2. The first width W1 may be larger than the second width W2. A width of the via portion 160V of the mold via 160 may gradually increase in a direction from the second semiconductor chip 220 toward the redistribution substrate 100.

A thickness of the second chip pad 221 may be a first thickness T1. The first thickness T1 may range from 5 μm to 15 μm. Although not shown, a thickness of the first chip pad 211 may be substantially equal to the thickness of the second chip pad 221. In other words, the thickness of the first chip pad 211 may range from 5 μm to 15 μm. The first thickness T1 may be larger than a thickness of the seed pattern 161 of the mold via 160.

The second chip pad 221 and the seed pattern 161 of the mold via 160 may be formed of or include the same metallic material. As an example, the second chip pad 221 and the seed pattern 161 of the mold via 160 may be formed of or include copper (Cu). A density of a metallic material of the seed pattern 161 of the mold via 160 may be different from a density of a metallic material of the second chip pad 221. For example, the density of the metallic material of the seed pattern 161 of the mold via 160 may be smaller than the density of the metallic material of the second chip pad 221.

An interface between the second chip pad 221 and the seed pattern 161 of the mold via 160 may be a second interface IF2. Since the seed pattern 161 of the mold via 160 and the second chip pad 221 include the same metallic material, the second interface IF2 may be invisible. For example, the seed pattern 161 of the mold via 160 and the second chip pad 221 may be provided as a single element.

The second redistribution pattern 120 may include a barrier/seed pattern 121 and a conductive pattern 123. The conductive pattern 123 of the second redistribution pattern 120 may be provided on the top surface of the first insulating layer 101 and in the first insulating layer 101. The conductive pattern 123 of the second redistribution pattern 120 may be formed of or include a conductive material (e.g., copper (Cu)). The barrier/seed pattern 121 of the second redistribution pattern 120 may be interposed between the conductive pattern 123 of the second redistribution pattern 120 and the first insulating layer 101. The barrier/seed pattern 121 of the second redistribution pattern 120 may be formed of or include at least one of conductive materials (e.g., copper, titanium, and/or alloys thereof). As an example, the barrier/seed pattern 121 of the second redistribution pattern 120 may be formed of or include a titanium/copper alloy.

Each of the via and wire portions 120V and 120W of the second redistribution pattern 120 may include the barrier/seed pattern 121 and the conductive pattern 123. The barrier/seed pattern 121 of the second redistribution pattern 120 may not be extended to regions on side and top surfaces of the conductive pattern 123 of the second redistribution pattern 120.

The third redistribution pattern 130 may include a barrier/seed pattern 131 and a conductive pattern 133. The conductive pattern 133 of the third redistribution pattern 130 may be provided on the top surface of the second insulating layer 102 and in the second insulating layer 102. The conductive pattern 133 of the third redistribution pattern 130 may be formed of or include a conductive material (e.g., copper (Cu)). The barrier/seed pattern 131 of the third redistribution pattern 130 may be interposed between the conductive pattern 133 of the third redistribution pattern 130 and the second insulating layer 102. The barrier/seed pattern 131 of the third redistribution pattern 130 may be formed of or include at least one of conductive materials (e.g., copper, titanium, and/or alloys thereof). As an example, the barrier/seed pattern 131 of the third redistribution pattern 130 may be formed of or include a titanium/copper alloy.

Each of the via portion 130V and the wire portion 130W of the third redistribution pattern 130 may include the barrier/seed pattern 131 and the conductive pattern 133. The barrier/seed pattern 131 of the third redistribution pattern 130 may not be extended to regions on side and top surfaces of the conductive pattern 133 of the third redistribution pattern 130.

Referring to FIG. 2B, the first redistribution pattern 110 may include a seed pattern 111 and a conductive pattern 113. The seed pattern 111 of the first redistribution pattern 110 may be provided on the second molding portion 320. The conductive pattern 113 of the first redistribution pattern 110 may be interposed between the seed pattern 111 of the first redistribution pattern 110 and the second redistribution pattern 120. The conductive pattern 113 of the first redistribution pattern 110 may be formed of or include a conductive material. As an example, the conductive pattern 113 of the first redistribution pattern 110 may be formed of or include copper (Cu). The seed pattern 111 of the first redistribution pattern 110 may be interposed between the conductive pattern 113 of the first redistribution pattern 110 and the bump pattern 150. The seed pattern 111 of the first redistribution pattern 110 may be formed of or include a conductive material. As an example, the seed pattern 111 of the first redistribution pattern 110 may be formed of or include electroless copper. The seed pattern 111 of the first redistribution pattern 110 may not include titanium.

The seed and conductive patterns 111 and 113 of the first redistribution pattern 110 may be formed of or include the same metallic material. In an embodiment, each of the seed pattern 111 and the conductive pattern 113 of the first redistribution pattern 110 may be formed of or include copper (Cu). A density of a metallic material of the seed pattern 111 of the first redistribution pattern 110 may be different from a density of a metallic material of the conductive pattern 113 of the first redistribution pattern 110. For example, the density of the metallic material of the seed pattern 111 of the first redistribution pattern 110 may be smaller than the density of the metallic material of the conductive pattern 113 of the first redistribution pattern 110.

An interface between the seed and conductive patterns 111 and 113 of the first redistribution pattern 110 may be a third interface IF3. Since the seed and conductive patterns 111 and 113 of the first redistribution pattern 110 include the same metallic material, the third interface IF3 may be invisible. For example, the seed and conductive patterns 111 and 113 of the first redistribution pattern 110 may be provided as a single element.

The bump pattern 150 may be in contact with the first redistribution pattern 110. A width of the bump pattern 150 may be a third width W3. As an example, the third width W3 may be constant, regardless of the height of the bump pattern 150.

An interface between the seed pattern 111 of the first redistribution pattern 110 and the bump pattern 150 may be a fourth interface IF4. An interface between the bump pattern 150 and the third chip pad 231 may be a fifth interface IF5. As an example, the bump pattern 150, the third chip pad 231, and the seed pattern 111 of the first redistribution pattern 110 may be formed of or include the same metallic material (e.g., copper). In this case, the fourth interface IF4 and the fifth interface IF5 may be invisible.

FIGS. 3A to 3J are sectional views illustrating a method of fabricating a semiconductor package according to an embodiment of inventive concepts.

Figure 3A:
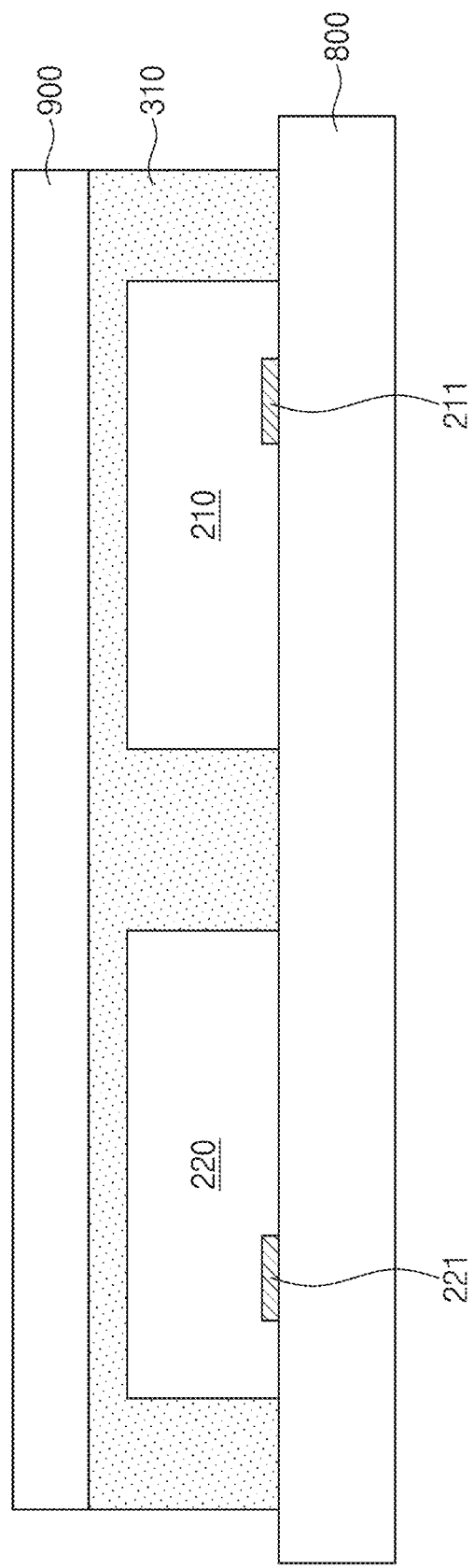
FIGS. 3A to 3J are sectional views illustrating a method of fabricating a semiconductor package according to an embodiment of inventive concepts.

Referring to FIG. 3A, the first and second semiconductor chips 210 and 220 may be disposed on a tape 800. The tape 800 may be formed of or include, for example, polyimide. Each of the first and second semiconductor chips 210 and 220 may include the active surface 210a or 220a and the inactive surface 210b or 220b, which are opposite to each other. The first semiconductor chip 210 may include the first chip pad 211 disposed adjacent to the active surface 210a. The second semiconductor chip 220 may include the second chip pad 221 disposed adjacent to the active surface 220a. The first and second semiconductor chips 210 and 220 may be disposed on the tape 800 in a face-down manner Each of the first and second semiconductor chips 210 and 220 may be a memory chip (e.g., a DRAM, SRAM, MRAM, or FLASH memory chip). In an embodiment, each of the first and second semiconductor chips 210 and 220 may be a logic chip.

The first molding portion 310 may be formed to cover the first and second semiconductor chips 210 and 220. The first molding portion 310 may be formed of or include an insulating polymer (e.g., an epoxy-based polymer). The first molding portion 310 may further include a reinforcement element (e.g., a silicon filler). A grinding process may be additionally performed after the formation of the first molding portion 310. As a result, the top surface of the first molding portion 310 may become flat. A carrier substrate 900 may be disposed on the top surface of the first molding portion 310.

Figure 3B:
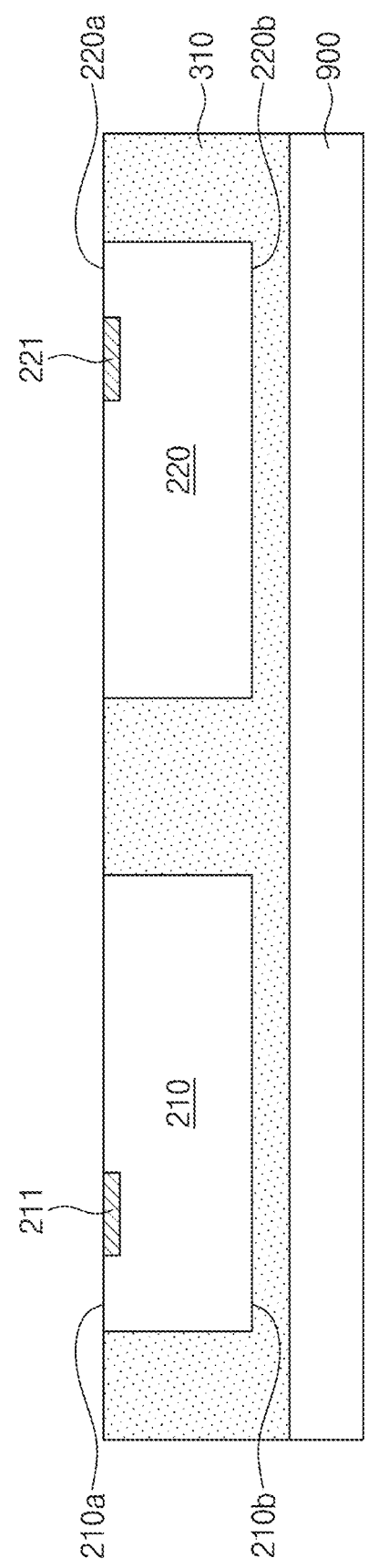

Referring to FIG. 3B, the resulting structure of FIG. 3A may be inverted, and then, the tape 800 may be removed. Accordingly, the first and second chip pads 211 and 221 may be exposed to the outside near the active surfaces 210a and 220a of the first and second semiconductor chips 210 and 220, respectively.

Figure 3C:
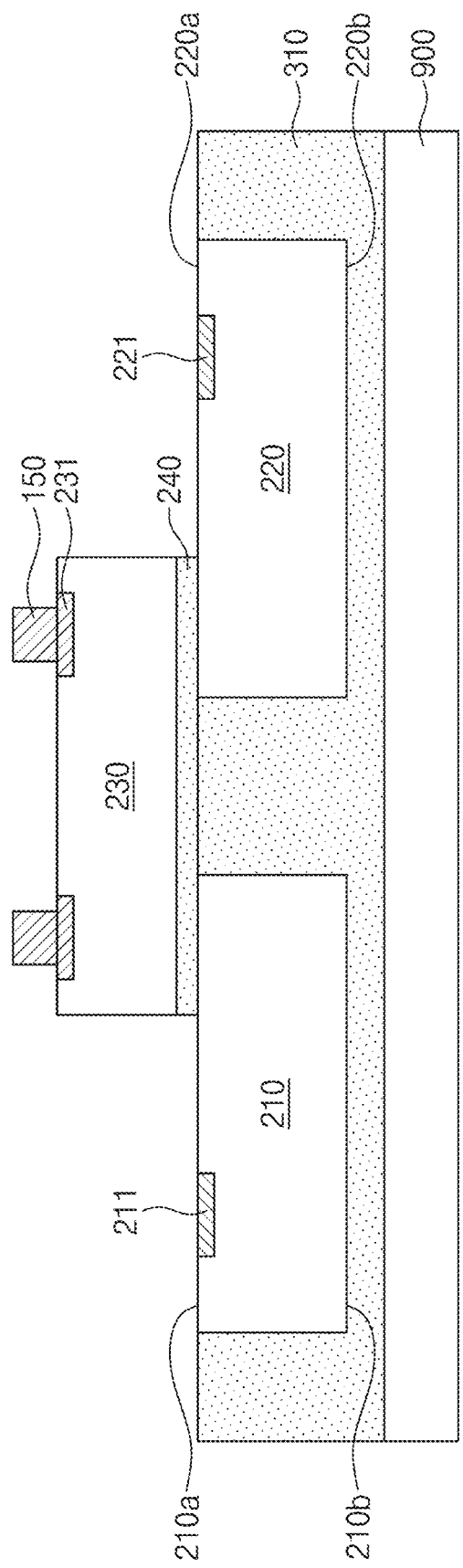

Referring to FIG. 3C, the third semiconductor chip 230 may be disposed on the first and second semiconductor chips 210 and 220. In an embodiment, the third semiconductor chip 230 may be a logic chip. The third semiconductor chip 230 may include the third chip pads 231, which are disposed adjacent to an active surface thereof. The adhesive layer 240 may be interposed between the third semiconductor chip 230 and the first semiconductor chip 210 and between the third semiconductor chip 230 and the second semiconductor chip 220. The bump patterns 150 may be disposed on the third chip pads 231 of the third semiconductor chip 230.

Figure 3D:
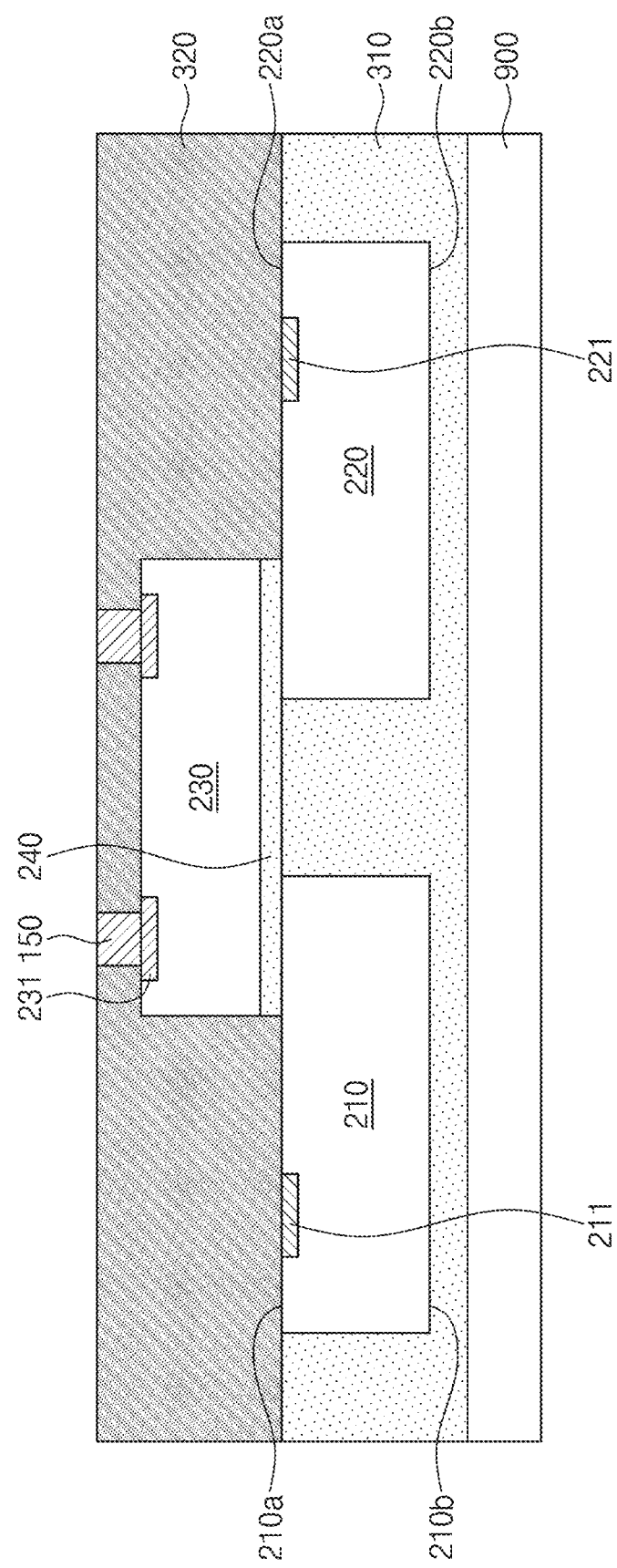

Referring to FIG. 3D, the second molding portion 320 may be formed to cover the third semiconductor chip 230. The second molding portion 320 may be formed of or include an insulating polymer (e.g., epoxy-based polymer). The second molding portion 320 may further include a reinforcement element (e.g., a silicon filler). A grinding process may be additionally performed after the formation of the second molding portion 320. As a result, the top surface of the second molding portion 320 may become flat. The top surface of the second molding portion 320 may be coplanar with the top surface of each of the bump patterns 150.

The first and second molding portions 310 and 320 may be formed of or include different epoxy-based polymers. In an embodiment, the first and second molding portions 310 and 320 may be formed of or include the same epoxy-based polymer but the contents of the reinforcement elements (e.g., silicon fillers) therein may be different from each other. In other words, the first and second molding portions 310 and 320 may be formed to have different material properties from each other. For example, the first and second molding portions 310 and 320 may differ from each other in their thermal expansion coefficient and/or elastic modulus.

Figure 3E:
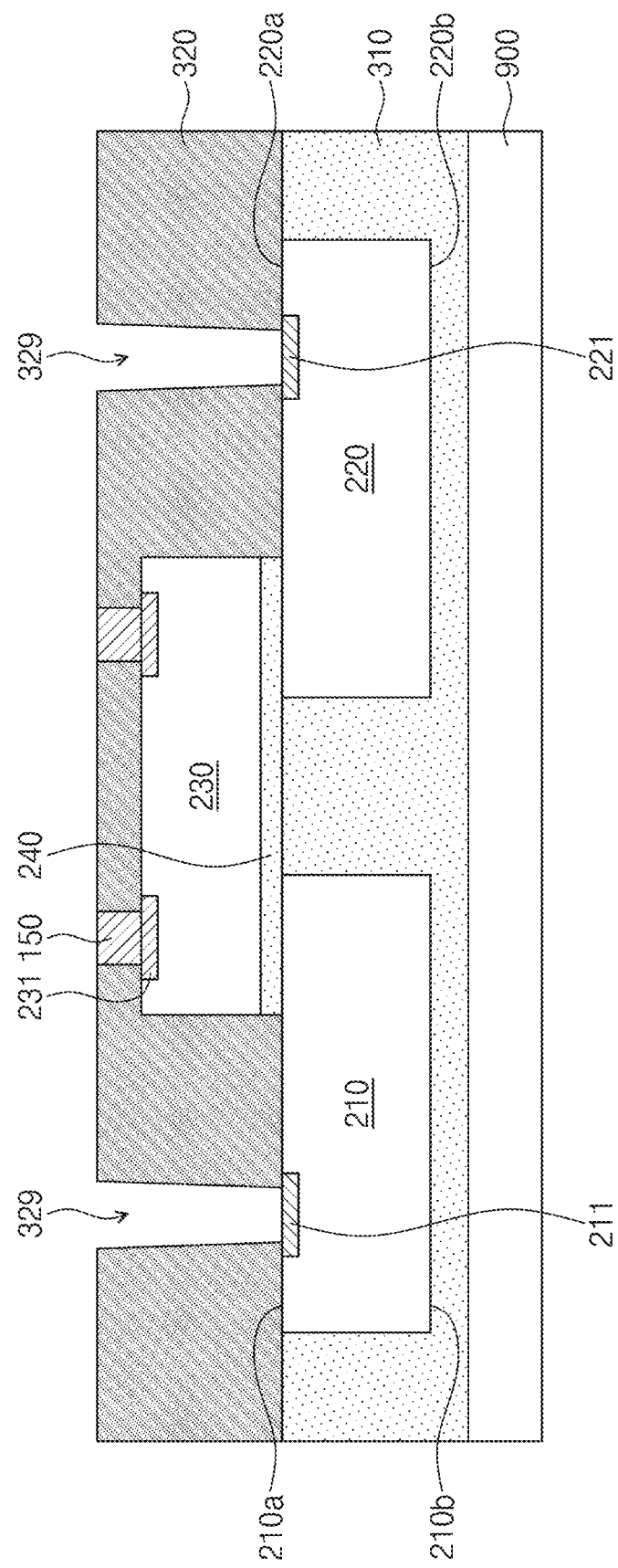

Referring to FIG. 3E, mold holes 329 may be formed by patterning the second molding portion 320. As an example, the patterning process may be a laser drilling process. The mold hole 329 may be a hole that is formed to penetrate the second molding portion 320. The mold hole 329 may be formed to expose one of the first chip pad 211 or the second chip pad 221. In an embodiment, the mold hole 329 may be formed to have a gradually increasing width in an upward direction.

Figure 3F:
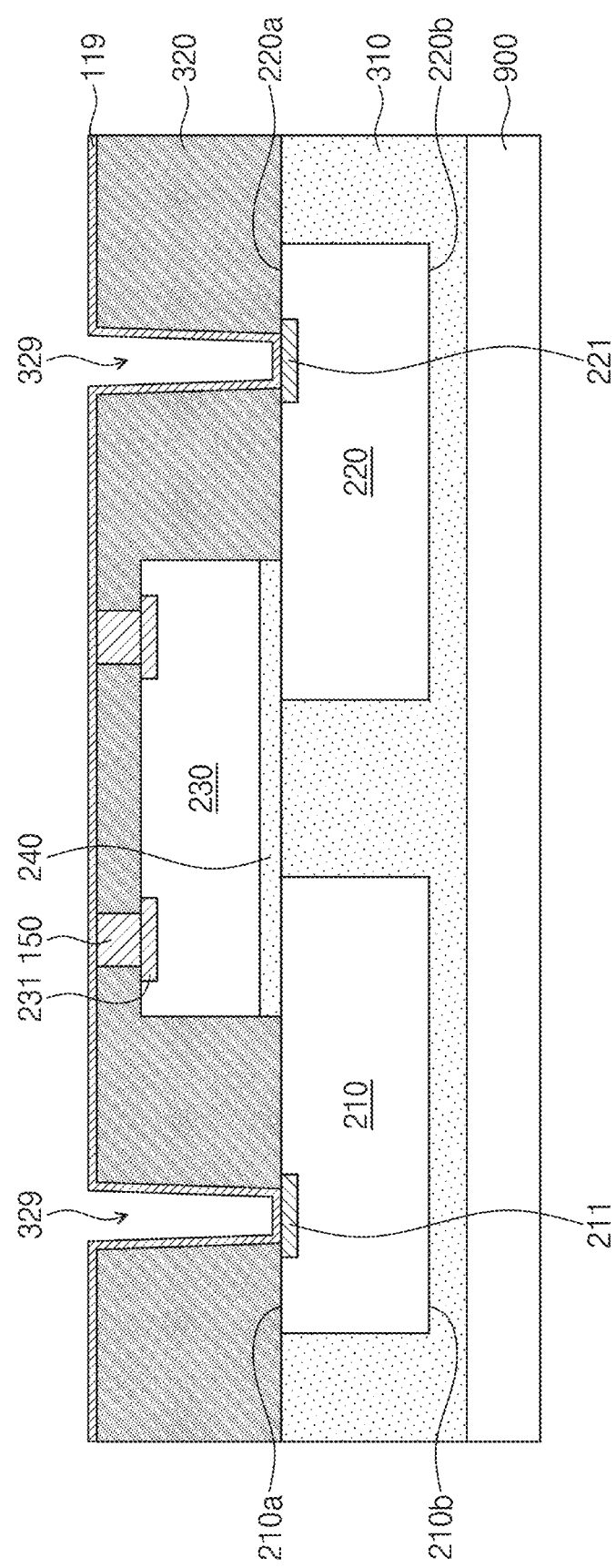

Referring to FIG. 3F, a first seed layer 119 may be formed along the top surface of the second molding portion 320 and an inner side surface and a bottom surface of the mold hole 329. The first seed layer 119 may conformally cover the top surface of the second molding portion 320, the top surface of each of the bump patterns 150, the inner side surface of the mold hole 329, the top surface of the first chip pad 211, and the top surface of the second chip pad 221. The first seed layer 119 may be formed of or include a conductive metallic material. As an example, the first seed layer 119 may be formed of or include electroless copper.

Figure 3G:
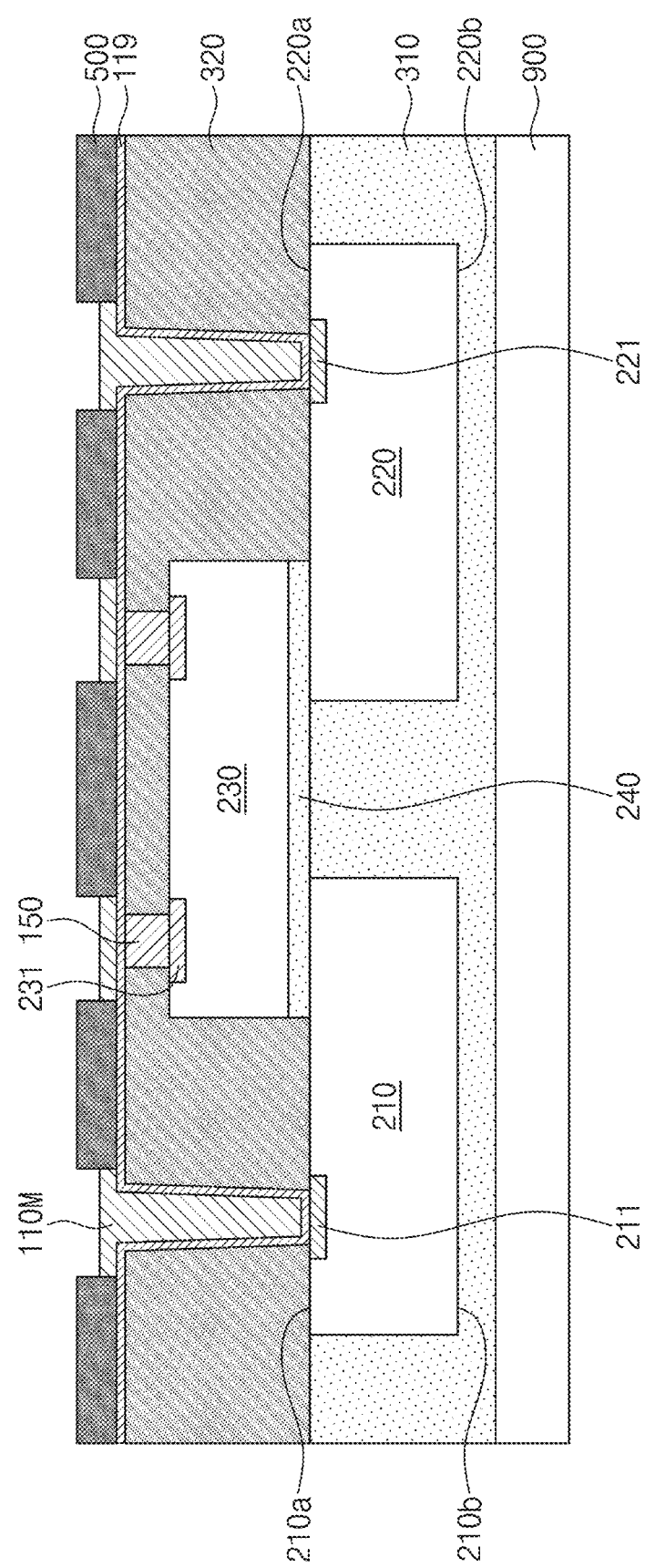

Referring to FIG. 3G, first resist patterns 500 may be formed on the first seed layer 119. The formation of the first resist pattern 500 may include forming a photoresist material on the first seed layer 119 and patterning the first resist pattern 500 to form first openings. The patterning of the first resist pattern 500 may be performed through exposing and developing processes. Each of the first openings may be formed to expose a portion of the first seed layer 119.

First conductive layers 110M may be respectively formed in the first openings to cover the first seed layer 119. The first conductive layers 110M may fill lower portions of the first openings, respectively. For example, the first conductive layers 110M may fill the first openings, respectively, but may not be extended to a region on a top surface of the first resist pattern 500. The first conductive layers 110M may be formed by an electroplating process using the first seed layer 119 as an electrode. An additional planarization process may not be performed during the formation of the first conductive layers 110M. Each of the first conductive layers 110M may be formed of or include a conductive metallic material. As an example, each of the first conductive layers 110M may be formed of or include copper (Cu). The first conductive layers 110M and the first seed layer 119 may be formed of or include the same metallic material. A density of a metallic material of the first conductive layer 110M may be different from a density of a metallic material of the first seed layer 119. For example, the density of the metallic material of the first seed layer 119 may be smaller than the density of the metallic material of the first conductive layer 110M.

Figure 3H:
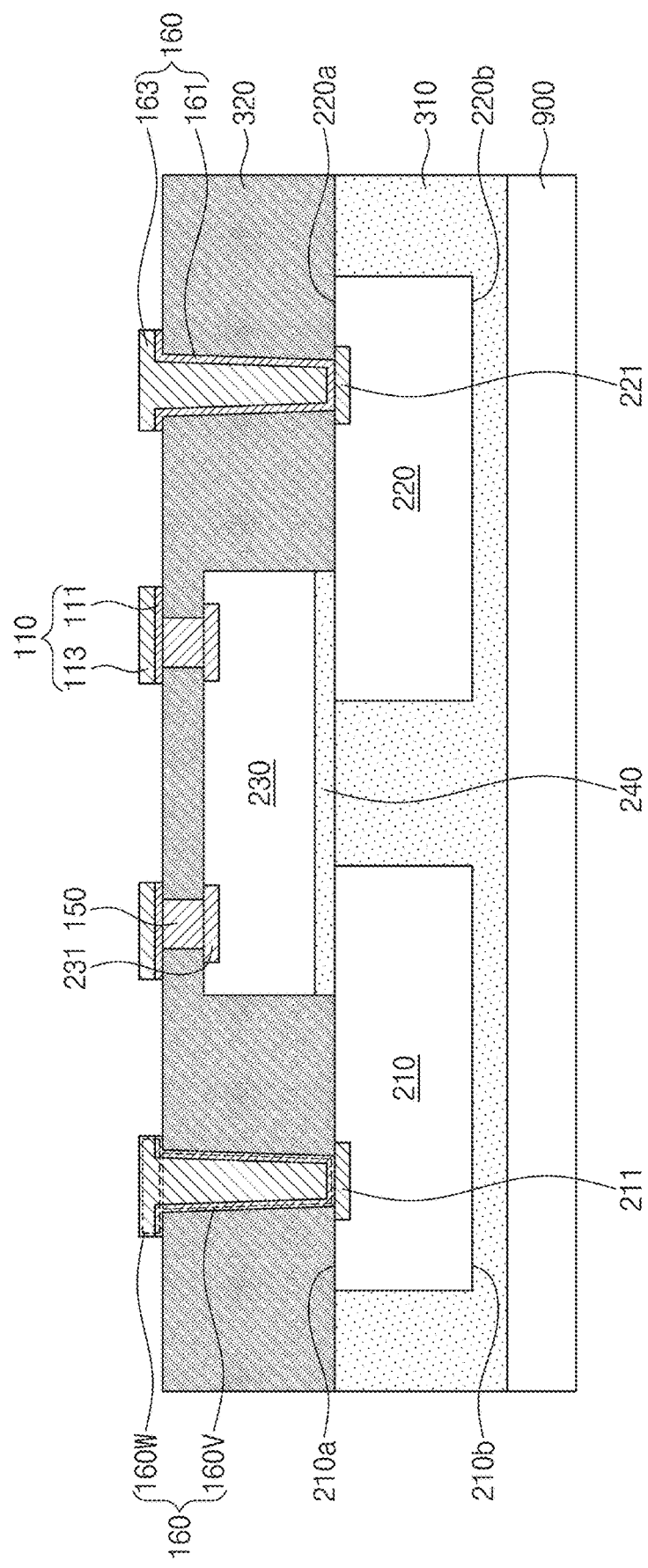

Referring to FIG. 3H, the first resist pattern 500 may be removed, and thus, a top surface of a first portion of the first seed layer 119 may be exposed. For example, the first resist pattern 500 may be removed by a strip process.

The seed pattern 161 of the mold via 160 and the seed pattern 111 of the first redistribution pattern 110 may be formed by removing the exposed first portion of the first seed layer 119. In an embodiment, the first portion of the first seed layer 119 may be removed by an etching process. The etching process may be a wet etching process. In the etching process, the first conductive layers 110M may have an etch selectivity with respect to the first seed layer 119. The first seed layer 119 may include second portions, which are disposed below bottom surfaces of the first conductive layers 110M and are not exposed to the etching process. The second portions of the first seed layer 119, which are left after the etching process, may form the seed pattern 161 of the mold via 160 and the seed pattern 111 of the first redistribution pattern 110. The first conductive layers 110M may constitute the conductive pattern 163 of the mold via 160 and the conductive pattern 113 of the first redistribution pattern 110. Accordingly, the first redistribution patterns 110 and the mold via 160 may be formed. The first redistribution pattern 110 may include the seed pattern 111 and the conductive pattern 113, and the mold via 160 may include the seed pattern 161 and the conductive pattern 163.

The mold via 160 may include the via portion 160V and the wire portion 160W. The via portion 160V of the mold via 160 may be provided on one of the mold holes 329.

Figure 3I:
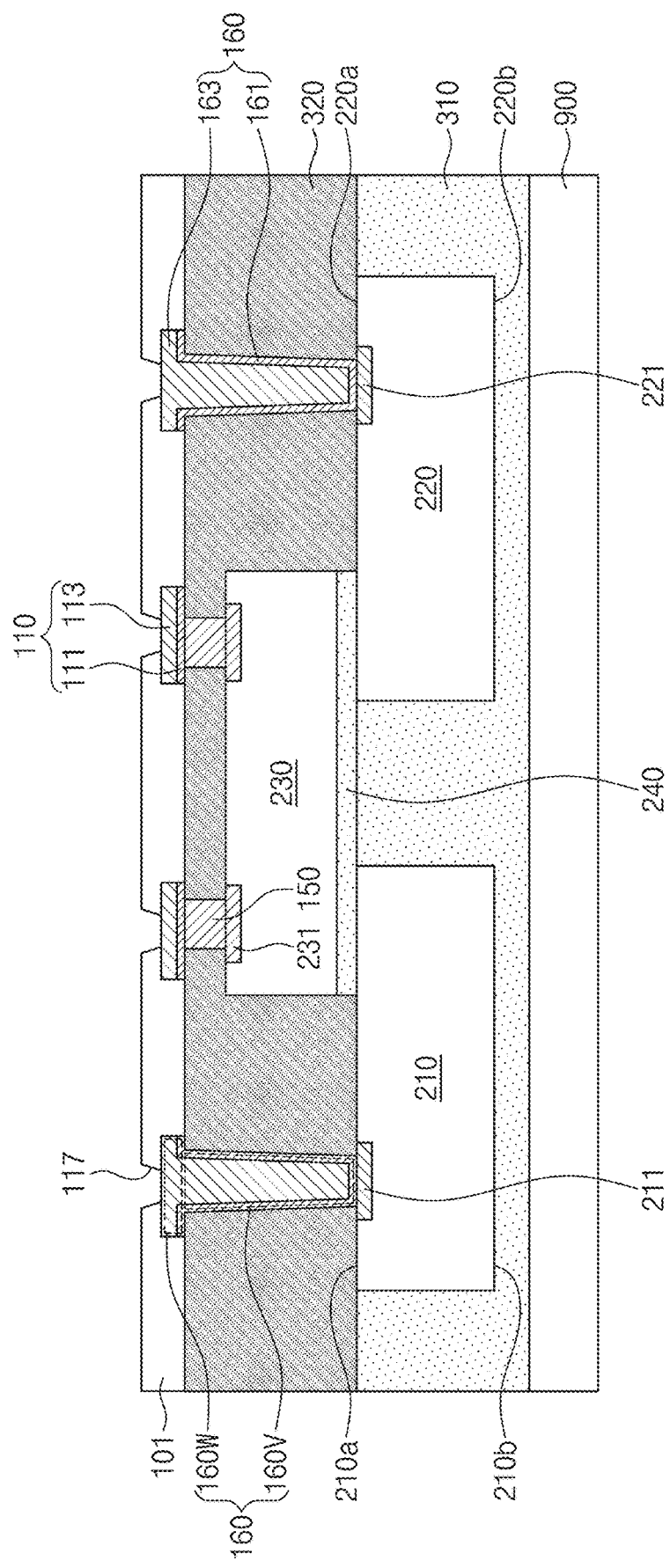

Referring to FIG. 3I, the first insulating layer 101 may be formed on the second molding portion 320. The first insulating layer 101 may cover the top surface of the second molding portion 320, the top and side surfaces of the first redistribution pattern 110, and the top and side surfaces of the wire portion 160W of the mold via 160. In an embodiment, the first insulating layer 101 may be formed through a coating process (e.g., a spin coating process or a slit coating process). The first insulating layer 101 may be formed of or include at least one of organic materials (e.g., a photosensitive polymer) or photo-imageable dielectric (PID) resins. In the present specification, the photosensitive polymer may include at least one of, for example, photosensitive polyimide, polybenzoxazole, phenol-based polymer, or benzocyclobutene-based polymer.

The first insulating layer 101 may be patterned to form a first hole 117 in the first insulating layer 101. The patterning of the first insulating layer 101 may be performed through exposing and developing processes. The first hole 117 may be formed to expose a top surface of one of the first redistribution pattern 110 and the mold via 160. The first hole 117 may be formed to have a tapered shape. For example, a diameter of an upper region of the first hole 117 may be larger than a diameter of a lower region of the first hole 117. A width of the upper region of the first hole 117 may be larger than a width of the lower region of the first hole 117. An inner side surface of the first insulating layer 101 may be defined by the first hole 117.

Figure 3J:
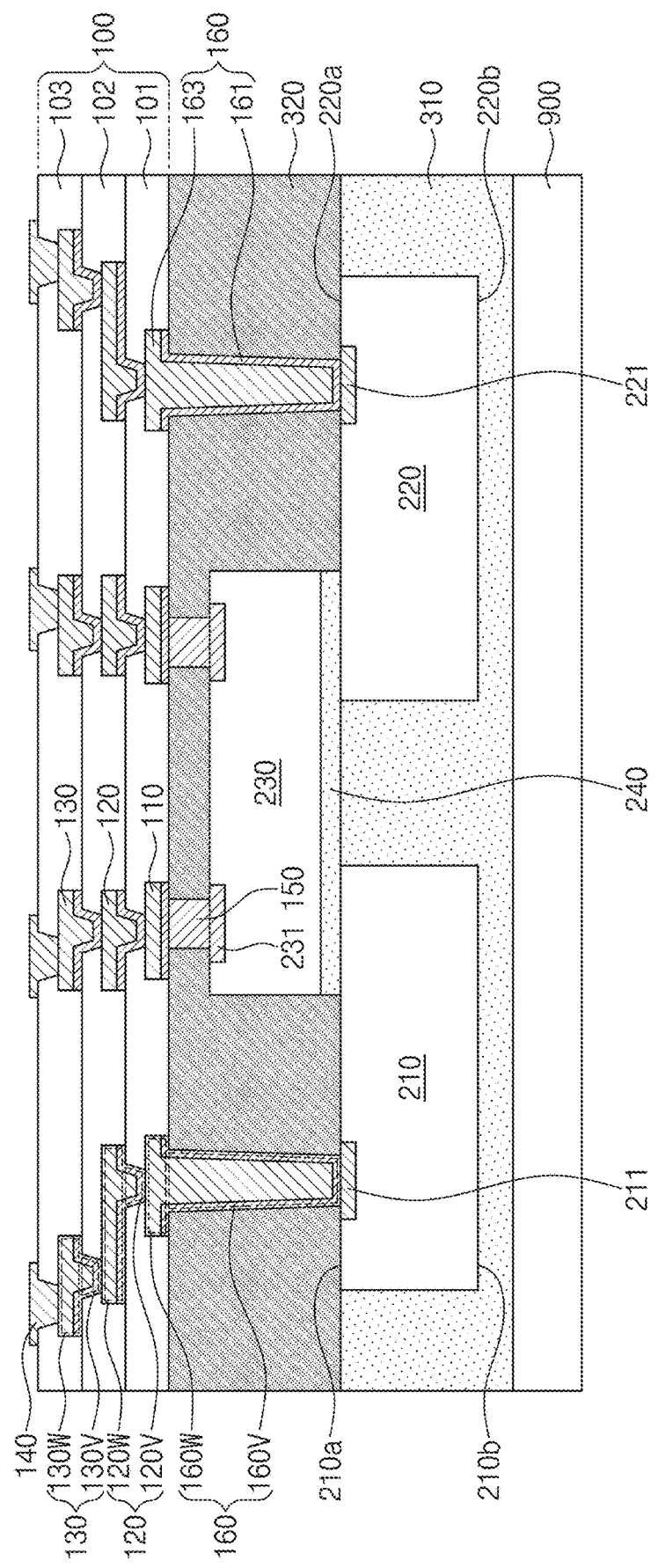

Referring to FIG. 3J, a second barrier/seed layer (not shown) may be formed along the top surface of the first insulating layer 101 and an inner side surface and a bottom surface of the first hole 117. The second barrier/seed layer may conformally cover the top surface of the first insulating layer 101, the inner side surface of the first insulating layer 101, the top surface of the first redistribution pattern 110, and the top surface of the mold via 160. The second barrier/seed layer may be formed of or include at least one of conductive materials (e.g., copper, titanium, and/or alloys thereof). As an example, the second barrier/seed layer may be formed of or include a titanium/copper alloy.

Second resist patterns (not shown) may be formed on the second barrier/seed layer. The formation of the second resist pattern may include forming a photoresist material on the second barrier/seed layer and patterning the second resist pattern to form second openings. The patterning of the second resist pattern may be performed through exposing and developing processes. Each of the second openings may be formed to expose a portion of the second barrier/seed layer.

Second conductive layers (not shown) may be formed in the second openings, respectively, to cover the second barrier/seed layer. The second conductive layers may be formed by an electroplating process using the second barrier/seed layer as an electrode. Each of the second conductive layers may be formed of or include a conductive metallic material. For example, each of the second conductive layers may be formed of or include copper (Cu).

The second resist pattern may be removed, and in this case, a top surface of a first portion of the second barrier/seed layer may be exposed. The barrier/seed pattern 121 of the second redistribution pattern 120 may be formed by removing the exposed first portion of the second barrier/seed layer. The removal of the first portion of the second barrier/seed layer may be performed by an etching process. The etching process may be a wet etching process. In the etching process, the second conductive layers may have an etch selectivity with respect to the second barrier/seed layer. The second barrier/seed layer may include second portions, which are disposed below bottom surface of the second conductive layers and are not exposed to the etching process. The second portions of the second barrier/seed layer, which are left after the etching process, may form the barrier/seed pattern 121 of the second redistribution pattern 120. The second conductive layers may constitute the conductive pattern 123 of the second redistribution pattern 120.

The second redistribution pattern 120 may include the via portion 120V and the wire portion 120W. The via portion 120V of the second redistribution pattern 120 may be provided in one of the first holes 117.

The second insulating layer 102 may be formed to cover the second redistribution pattern 120. For example, the second insulating layer 102 may be formed to cover top and side surfaces of the wire portion 120W of the second redistribution pattern 120. The second insulating layer 102 may be formed by a coating process (e.g., a spin coating process or a slit coating process). The second insulating layer 102 may be formed of or include the same material as the first insulating layer 101.

The third redistribution pattern 130 may be formed on the second redistribution pattern 120. In an embodiment, the third redistribution pattern 130 may be formed by substantially the same process as that for the second redistribution pattern 120.

The third insulating layer 103 may be formed to cover the third redistribution pattern 130. The bonding pad 140 may be formed on the third redistribution pattern 130.

Referring back to FIG. 1, the connection terminal 400 may be formed on the bonding pad 140. The formation of the connection terminal 400 may include performing a solder ball attaching process on the bonding pad 140.

Figure 4:
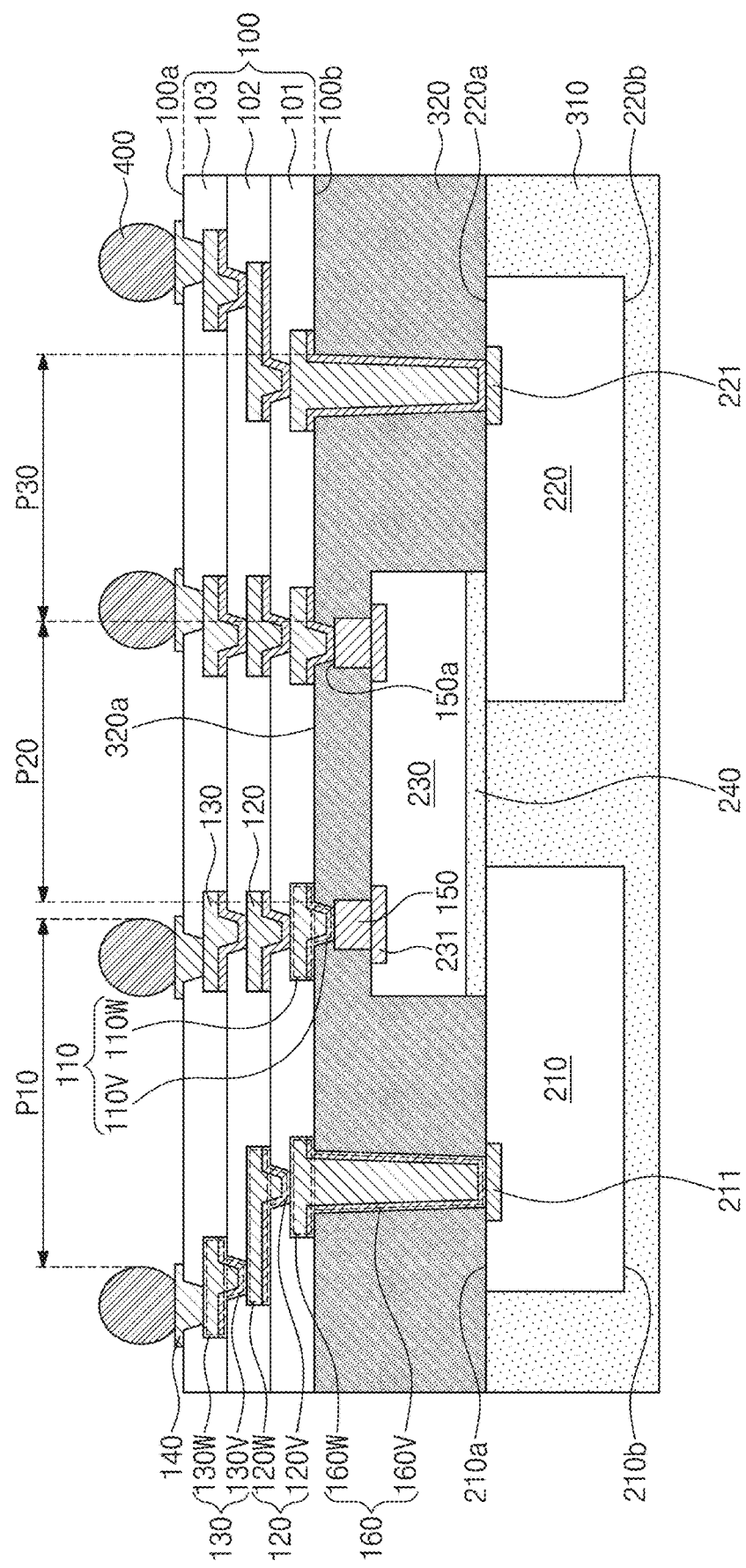
FIG. 4 is a sectional view illustrating a semiconductor package according to an embodiment of inventive concepts.

FIG. 4 is a sectional view illustrating a semiconductor package according to an embodiment of inventive concepts. For concise description, an element previously described with reference to FIGS. 1, 2A, and 2B may be identified by the same reference number without repeating an overlapping description thereof.

Referring to FIG. 4, the first redistribution pattern 110 may include a via portion 110V and a wire portion 110W. The wire portion 110W of the first redistribution pattern 110 may be disposed in the first insulating layer 101. The wire portion 110W of the first redistribution pattern 110 may be disposed on the top surface of the second molding portion 320. The wire portion 110W of the first redistribution pattern 110 may be in contact with the second redistribution pattern 120. The via portion 110V of the first redistribution pattern 110 may be provided on the bump pattern 150 and may be connected to the wire portion 110W of the first redistribution pattern 110. The via portion 110V may be a portion of the first redistribution pattern 110 which is extended from the wire portion 110W of the first redistribution pattern 110 in a direction perpendicular to the first surface 100a of the redistribution substrate 100. In detail, the via portion 110V may be a portion of the first redistribution pattern 110 which is extended from the wire portion 110W of the first redistribution pattern 110 in a direction from the first surface 100a of the redistribution substrate 100 toward the second surface 100b. The wire portion 110W of the first redistribution pattern 110 may have a width or length larger than the via portion 110V of the first redistribution pattern 110. The via portion 110V of the first redistribution pattern 110 may be provided in the second molding portion 320. The via portion 110V of the first redistribution pattern 110 may be provided to penetrate a portion of the second molding portion 320 and to be in contact with the bump pattern 150. A top surface 320a of the second molding portion 320 may be located at a level higher than a top surface 150a of each of the bump patterns 150.

According to an embodiment of inventive concepts, a plurality of semiconductor chips in a semiconductor package may not be mounted separately in a plurality of package substrates. Accordingly, it may be possible to reduce a total thickness of the semiconductor package, to omit a process of additionally forming a redistribution substrate or a post, and to simplify a fabrication process. As a result, it may be possible to reduce a size of the semiconductor package and to reduce fabrication cost.

According to an embodiment of inventive concepts, a semiconductor package may include a first molding portion covering first and second semiconductor chips and a second molding portion covering a third semiconductor chip, and the first molding portion and the second molding portion may have different material properties from each other. Accordingly, it may be possible to more easily control a warpage phenomenon in the semiconductor package. As a result, reliability of the semiconductor package may be improved.

While some example embodiments of inventive concepts have been particularly shown and described, it will be understood by one of ordinary skill in the art that variations in form and detail may be made therein without departing from the spirit and scope of inventive concepts in the attached claims.

What is claimed is:

1. A semiconductor package, comprising:
   a redistribution substrate comprising a first surface and a second surface, which are opposite each other;
   a first semiconductor chip on the first surface of the redistribution substrate;
   a first molding portion on a side surface of the first semiconductor chip;
   a second semiconductor chip between the first semiconductor chip and the redistribution substrate;
   a second molding portion between the redistribution substrate and the first molding portion, the second molding portion on a side surface of the second semiconductor chip;
   bump patterns between the second semiconductor chip and the redistribution substrate; and
   a mold via penetrating the second molding portion and electrically connecting the first semiconductor chip to the redistribution substrate, wherein the redistribution substrate comprises an insulating layer,
a first redistribution pattern in the insulating layer, and
a second redistribution pattern in the insulating layer,
the first redistribution pattern and the second redistribution pattern are sequentially stacked in a direction from the first surface of the redistribution substrate toward the second surface,
the mold via is in contact with the second redistribution pattern, and
the bump patterns are in contact with the first redistribution pattern.

2. The semiconductor package of claim 1, wherein
the mold via comprises a wire portion and a via portion,
the wire portion is on the second molding portion; and
the via portion extends vertically and penetrates the second molding portion, and
a width of the via portion of the mold via increases in a direction from the first semiconductor chip toward the redistribution substrate.

3. The semiconductor package of claim 1, further comprising:
a third semiconductor chip in the first molding portion and spaced apart from the first semiconductor chip,
wherein the second semiconductor chip is between the third semiconductor chip and the redistribution substrate.

4. The semiconductor package of claim 1, wherein
the first semiconductor chip comprises an active surface and an inactive surface, which are opposite each other, and
the first molding portion is in contact with the inactive surface of the first semiconductor chip.

5. The semiconductor package of claim 4, further comprising:
an adhesive layer between the first semiconductor chip and the second semiconductor chip,
wherein the adhesive layer is in contact with the active surface of the first semiconductor chip, and
a bottom surface of the adhesive layer is coplanar with a bottom surface of the second molding portion.

6. The semiconductor package of claim 1, wherein a thermal expansion coefficient of the first molding portion and a thermal expansion coefficient of the second molding portion are different from each other.

7. The semiconductor package of claim 1, wherein
the mold via comprises a seed pattern and a conductive pattern on the seed pattern,
the seed pattern is in contact with the second molding portion,
the seed pattern and the conductive pattern comprise a same metallic material, and
a density of the metallic material in the seed pattern is different from a density of the metallic material in the conductive pattern.

8. The semiconductor package of claim 1, wherein
the first semiconductor chip comprises a chip pad, which is provided therein and contacts the mold via, and
a thickness of the chip pad ranges from 5 µm to 15 µm.

9. The semiconductor package of claim 1, further comprising:
connection terminals on the second surface of the redistribution substrate,
wherein a pitch between the connection terminals is larger than a pitch between the bump patterns.

10. The semiconductor package of claim 1, wherein a top surface of the second molding portion is at a level higher than a top surface of each of the bump patterns.

11. A semiconductor package, comprising:
a redistribution substrate comprising a first surface and a second surface, which are opposite to each other;
a first semiconductor chip and a second semiconductor chip on the first surface of the redistribution substrate, each of the first semiconductor chip and the second semiconductor chip comprising an active surface and an inactive surface, which are opposite each other;
a third semiconductor chip between the first semiconductor chip and the redistribution substrate and between the second semiconductor chip and the redistribution substrate;
a first molding portion on a side surface of each of the first semiconductor chip and the second semiconductor chip;
a second molding portion between the redistribution substrate and the first molding portion, the second molding portion on a side surface of the third semiconductor chip; and
a mold via penetrating the second molding portion and electrically connecting the redistribution substrate to the first semiconductor chip,
wherein a width of the mold via in the second molding portion increases in a direction from the first semiconductor chip toward the redistribution substrate, and
the first molding portion is in contact with the inactive surface of each of the first semiconductor chip and the second semiconductor chip.

12. The semiconductor package of claim 11, wherein
the mold via comprises a seed pattern and a conductive pattern on the seed pattern,
the seed pattern is in contact with the second molding portion, and
the seed pattern and the conductive pattern comprise a same material.

13. The semiconductor package of claim 11, wherein
the redistribution substrate comprises an insulating layer, a first redistribution pattern in the insulating layer, and a second redistribution pattern in the insulating layer,
the first redistribution pattern and the second redistribution pattern are sequentially stacked in a direction from the first surface of the redistribution substrate toward the second surface,
the first redistribution pattern comprises a seed pattern and a conductive pattern on the seed pattern, which is in contact with the second molding portion, and a conductive pattern, which is provided on the seed pattern, and
the seed pattern and the conductive pattern of the first redistribution pattern comprise a same material.

14. The semiconductor package of claim 13, further comprising:
a bump pattern between the third semiconductor chip and the redistribution substrate,
wherein the mold via is in contact with the second redistribution pattern, and
the bump pattern is in contact with the first redistribution pattern.

15. The semiconductor package of claim 11, wherein a thermal expansion coefficient of the first molding portion and a thermal expansion coefficient of the second molding portion are different from each other.

16. A semiconductor package, comprising:
a redistribution substrate comprising a first surface and a second surface, which are opposite each other, wherein the redistribution substrate includes an insulating layer, a first redistribution pattern in the insulating layer, a second redistribution pattern in the insulating layer, a third redistribution pattern in the insulating layer, and a bonding pad on the third redistribution pattern, and the first redistribution pattern, the second redistribution pattern, and the third redistribution pattern are sequentially stacked in a direction from the first surface of the redistribution substrate toward the second surface;

a first semiconductor chip and a second semiconductor chip on the first surface of the redistribution substrate, each of the first semiconductor chip and the second semiconductor chip comprising an active surface and an inactive surface, which are opposite to each other;

a first chip pad adjacent to the active surface of the first semiconductor chip;

a second chip pad adjacent to the active surface of the second semiconductor chip;

a first molding portion on a side surface and the inactive surface of each of the first semiconductor chip and the second semiconductor chip;

a third semiconductor chip between the first semiconductor chip and the redistribution substrate and between the second semiconductor chip and the redistribution substrate;

an adhesive layer between the first semiconductor chip and the third semiconductor chip and between the second semiconductor chip and the third semiconductor chip;

a second molding portion between the redistribution substrate and the first molding portion, the second molding portion being provided on a side surface of the third semiconductor chip and a top surface of the third semiconductor chip;

bump patterns between the redistribution substrate and the third semiconductor chip;

a mold via penetrating the second molding portion and electrically connecting the redistribution substrate to the first semiconductor chip; and a connection terminal provided on the bonding pad, wherein the mold via is in contact with the second redistribution pattern, and the bump patterns are in contact with the first redistribution pattern.

17. The semiconductor package of claim 16, wherein a thickness of the first chip pad ranges from 5 µm to 15 µm.

18. The semiconductor package of claim 16, wherein a bottom surface of the adhesive layer is coplanar with a bottom surface of the second molding portion.

19. The semiconductor package of claim 16, wherein the mold via comprises a seed pattern and a conductive pattern on the seed pattern, the mold via is in contact with the second molding portion, the conductive pattern is on the seed pattern, and the seed pattern and the conductive pattern comprise a same material.

20. The semiconductor package of claim 16, wherein a top surface of the second molding portion is at a level higher than a top surface of each of the bump patterns.

* * * * *